(12) United States Patent
Henley et al.

(10) Patent No.: US 6,890,838 B2
(45) Date of Patent: *May 10, 2005

(54) GETTERING TECHNIQUE FOR WAFERS MADE USING A CONTROLLED CLEAVING PROCESS

(75) Inventors: Francois J. Henley, Los Gatos, CA (US); Nathan W. Cheung, Albany, CA (US)

(73) Assignee: Silicon Genesis Corporation, San Jose, CA (US)

( * ) Notice: Subject to any disclaimer, the term of this patent is extended or adjusted under 35 U.S.C. 154(b) by 22 days.

This patent is subject to a terminal disclaimer.

(21) Appl. No.: 10/402,356

(22) Filed: Mar. 26, 2003

(65) Prior Publication Data

US 2004/0097055 A1 May 20, 2004

Related U.S. Application Data (63) Continuation of application No. 09/631,891, filed on Aug. 4, 2000, now Pat. No. 6,548,382, which is a continuation of application No. 09/025,958, filed on Feb. 19, 1998, now abandoned.
(60) Provisional application No. 60/059,980, filed on Jul. 18, 1997.

(51) Int. Cl.[7] .............................................. H01L 21/322
(52) U.S. Cl. ...................................... 438/475; 438/526
(58) Field of Search ................................ 438/455, 471, 438/473, 474, 475, 476, 526

(56) References Cited

U.S. PATENT DOCUMENTS

| | | |
|---|---|---|
| 2,614,055 A | 10/1952 | Senarelens |
| 3,117,022 A | 1/1964 | Bronson et al. |
| 3,225,820 A | 12/1965 | Riordan |
| 3,390,033 A | 6/1968 | Brown |
| 3,551,213 A | 12/1970 | Boyle |
| 3,770,499 A | 11/1973 | Crowe et al. |
| 3,786,359 A | 1/1974 | King |
| 3,806,380 A | 4/1974 | Kitada et al. |
| 3,832,219 A | 8/1974 | Nelson et al. |
| 3,900,636 A | 8/1975 | Curry et al. |
| 3,901,423 A | 8/1975 | Hillberry et al. |
| 3,915,757 A | 10/1975 | Engel |
| 4,252,837 A | 2/1981 | Auton |
| 4,255,208 A | 3/1981 | Deutscher et al. |
| 4,274,004 A | 6/1981 | Kanai |
| 4,342,631 A | 8/1982 | White et al. |

(Continued)

FOREIGN PATENT DOCUMENTS

| | | |
|---|---|---|
| DE | 834363 | 9/1992 |
| EP | 665 587 A1 | 1/1969 |
| EP | 703 609 A1 | 2/1974 |

(Continued)

OTHER PUBLICATIONS

Alles et al., "Thin Film Silicon on Insulator: An Enabling Technology," *Semiconductor International*, pp. 67–72 (1997).

(Continued)

*Primary Examiner*—Chandra Chaudhari
(74) *Attorney, Agent, or Firm*—Townsend and Townsend and Crew LLP (57) ABSTRACT

A technique for forming a gettering layer in a wafer made using a controlled cleaving process. The gettering layer can be made by implanting using beam line or plasma immersion ion implantaion, or made by forming a film of material such as polysilicon by way of chemical vapor deposition. A controlled cleaving process is used to form the wafer, which is a multilayered silicon on insulator substrate. The gettering layer removes and/or attracts impurities in the wafer, which can be detrimental to the functionality and reliability of an integrated circuit device made on the wafer.

20 Claims, 6 Drawing Sheets

U.S. PATENT DOCUMENTS

| | | |
|---|---|---|
| 3,946,334 A | 3/1976 | Yonezu |
| 3,957,107 A | 5/1976 | Alotz et al. |
| 3,993,909 A | 11/1976 | Drews et al. |
| 4,006,340 A | 2/1977 | Gornais |
| 4,039,416 A | 8/1977 | White |
| 4,053,335 A | 10/1977 | Hu |
| 4,074,139 A | 2/1978 | Pankove |
| 4,107,350 A | 8/1978 | Berg et al. |
| 4,108,751 A | 8/1978 | King |
| 4,116,751 A | 9/1978 | Zaromb |
| 4,121,334 A | 10/1978 | Wallis |
| 4,170,662 A | 10/1979 | Weiss et al. |
| 4,216,906 A | 8/1980 | Olsen et al. |
| 4,237,601 A | 12/1980 | Woolhouse et al. |
| 4,244,348 A | 1/1981 | Wilkes |
| 4,346,123 A | 8/1982 | Kaufmann |
| 4,361,600 A | 11/1982 | Brown |
| 4,368,083 A | 1/1983 | Bruel et al. |
| 4,375,125 A | 3/1983 | Byatt |
| 4,412,868 A | 11/1983 | Brown et al. |
| 4,452,644 A | 6/1984 | Bruel et al. |
| 4,468,309 A | 8/1984 | White |
| 4,471,003 A | 9/1984 | Cann |
| 4,486,247 A | 12/1984 | Ecer et al. |
| 4,490,190 A | 12/1984 | Speri |
| 4,500,563 A | 2/1985 | Ellenberger et al. |
| 4,508,056 A | 4/1985 | Bruel et al. |
| 4,536,657 A | 8/1985 | Bruel |
| 4,539,050 A | 9/1985 | Kramler et al. |
| 4,566,403 A | 1/1986 | Fournier |
| 4,567,505 A | 1/1986 | Pease et al. |
| 4,568,563 A | 2/1986 | Jackson et al. |
| 4,585,945 A | 4/1986 | Bruel et al. |
| 4,645,546 A | 2/1987 | Matsushita |
| 4,684,535 A | 8/1987 | Heinecke et al. |
| 4,704,302 A | 11/1987 | Bruel et al. |
| 4,706,377 A | 11/1987 | Shuskus |
| 4,717,683 A | 1/1988 | Parillo et al. |
| 4,727,047 A | 2/1988 | Bozler et al. |
| 4,764,394 A | 8/1988 | Conrad |
| 4,766,086 A | 8/1988 | Ohshima et al. |
| 4,837,172 A | 6/1989 | Mizuno et al. |
| 4,846,928 A | 7/1989 | Dolins et al. |
| 4,847,792 A | 7/1989 | Barna et al. |
| 4,853,250 A | 8/1989 | Boulos et al. |
| 4,883,561 A | 11/1989 | Gmitter et al. |
| 4,887,005 A | 12/1989 | Rough et al. |
| 4,891,329 A | 1/1990 | Reisman et al. |
| 4,894,709 A | 1/1990 | Phillips et al. |
| 4,931,405 A | 6/1990 | Kamijo et al. |
| 4,948,458 A | 8/1990 | Ogle |
| 4,952,273 A | 8/1990 | Popov |
| 4,956,693 A | 9/1990 | Sawahata et al. |
| 4,960,073 A | 10/1990 | Suzuki et al. |
| 4,982,090 A | 1/1991 | Wittmaack |
| 4,983,251 A | 1/1991 | Haisma et al. |
| 4,996,077 A | 2/1991 | Moslehi |
| 5,015,353 A | 5/1991 | Hubler et al. |
| 5,034,343 A | 7/1991 | Rouse et al. |
| 5,070,040 A | 12/1991 | Pankove |
| 5,082,793 A | 1/1992 | Li |
| 5,102,821 A | 4/1992 | Moslehi |
| 5,110,748 A | 5/1992 | Sarma |
| 5,133,826 A | 7/1992 | Dandl |
| 5,162,241 A | 11/1992 | Mori et al. |
| 5,196,355 A | 3/1993 | Wittkower |
| 5,198,371 A | 3/1993 | Li |
| 5,202,095 A | 4/1993 | Houchin et al. |
| 5,203,960 A | 4/1993 | Dandl |
| 5,206,749 A | 4/1993 | Zavracky et al. |
| 5,213,451 A | 5/1993 | Frank |
| 5,234,529 A | 8/1993 | Johnson |
| 5,234,535 A | 8/1993 | Beyer et al. |
| 5,242,861 A | 9/1993 | Inaba |
| 5,250,328 A | 10/1993 | Otto |
| 5,252,178 A | 10/1993 | Moslehi |
| 5,256,562 A | 10/1993 | Vu et al. |
| 5,258,320 A | 11/1993 | Zavracky et al. |
| 5,258,325 A | 11/1993 | Spitzer et al. |
| 5,269,880 A | 12/1993 | Jolly et al. |
| 5,273,610 A | 12/1993 | Thomas, III et al. |
| 5,277,748 A | 1/1994 | Sakaguchi et al. |
| 5,303,574 A | 4/1994 | Matossian et al. |
| 5,304,509 A | 4/1994 | Sopori |
| 5,308,776 A | 5/1994 | Gotou |
| 5,317,236 A | 5/1994 | Zavracky et al. |
| 5,342,472 A | 8/1994 | Imahashi et al. |
| 5,344,524 A | 9/1994 | Sharma et al. |
| 5,354,381 A | 10/1994 | Sheng |
| 5,362,671 A | 11/1994 | Zavracky et al. |
| 5,363,603 A | 11/1994 | Miller et al. |
| 5,368,710 A | 11/1994 | Chen et al. |
| 5,370,765 A | 12/1994 | Dandl |
| 5,374,564 A | 12/1994 | Bruel |
| 5,376,560 A | 12/1994 | Aronowitz et al. |
| 5,377,031 A | 12/1994 | Vu et al. |
| 5,404,079 A | 4/1995 | Ohkuni et al. |
| 5,405,480 A | 4/1995 | Benzing et al. |
| 5,411,592 A | 5/1995 | Ovshinsky et al. |
| 5,413,679 A | 5/1995 | Godbey |
| 5,435,880 A | 7/1995 | Minato et al. |
| 5,438,241 A | 8/1995 | Zavracky et al. |
| 5,443,661 A | 8/1995 | Oguro et al. |
| 5,444,557 A | 8/1995 | Spitzer et al. |
| 5,459,016 A | 10/1995 | Debe et al. |
| 5,475,514 A | 12/1995 | Salerno et al. |
| 5,476,691 A | 12/1995 | Komvopoulos et al. |
| 5,480,842 A | 1/1996 | Clifton et al. |
| 5,487,785 A | 1/1996 | Horiike |
| 5,494,835 A | 2/1996 | Bruel |
| 5,504,328 A | 4/1996 | Bonser |
| 5,528,397 A | 6/1996 | Zavracky et al. |
| 5,539,245 A | 7/1996 | Imura et al. |
| 5,558,718 A | 9/1996 | Leung |
| 5,559,043 A | 9/1996 | Bruel |
| 5,569,620 A | 10/1996 | Linn et al. |
| 5,581,385 A | 12/1996 | Spitzer et al. |
| 5,585,304 A | 12/1996 | Hayashi et al. |
| 5,611,855 A | 3/1997 | Wijaranakula |
| 5,643,834 A | 7/1997 | Harada et al. |
| 5,646,053 A * | 7/1997 | Schepis et al. ............. 438/476 |
| 5,653,811 A | 8/1997 | Chan |
| 5,705,421 A | 1/1998 | Matsushita et al. |
| 5,710,057 A | 1/1998 | Kenny |
| 5,714,395 A | 2/1998 | Bruel |
| 5,744,852 A | 4/1998 | Linn et al. |
| 5,753,560 A | 5/1998 | Hong et al. |
| 5,755,914 A | 5/1998 | Yonehara |
| 5,763,319 A | 6/1998 | Ling et al. |
| 5,783,022 A | 7/1998 | Cha et al. |
| 5,804,086 A | 9/1998 | Bruel |
| 5,821,158 A | 10/1998 | Shishiguchi |
| 5,824,595 A | 10/1998 | Igel et al. |
| 5,827,751 A | 10/1998 | Nuyen |
| 5,840,590 A | 11/1998 | Myers, Jr. et al. |
| 5,854,123 A | 12/1998 | Sato et al. |
| 5,869,387 A | 2/1999 | Sato et al. |
| 5,877,070 A | 3/1999 | Goesele et al. |
| 5,882,987 A | 3/1999 | Srikrishnan |
| 5,909,627 A | 6/1999 | Egloff |
| 5,920,764 A | 7/1999 | Hanson et al. |

| | | | | | | |
|---|---|---|---|---|---|---|
| 5,953,622 | A | 9/1999 | Lee et al. | JP | 2910001 B2 | 8/1984 |
| 5,966,620 | A | 10/1999 | Sakaguchi et al. | JP | 59-054217 A | 11/1984 |
| 5,985,742 | A | 11/1999 | Henley et al. | JP | 58-144475 A | 10/1985 |
| 5,993,677 | A | 11/1999 | Biasse et al. | JP | 59-139539 A | 7/1989 |
| 5,994,207 | A | 11/1999 | Henley et al. | JP | 60-083591 A | 11/1990 |
| 6,010,579 | A | 1/2000 | Henley et al. | JP | 60-207237 A | 4/1995 |
| 6,013,563 | A | 1/2000 | Henley et al. | JP | 60-235434 A | 8/1995 |
| 6,013,567 | A | 1/2000 | Henley et al. | JP | 3-109731 A | 10/1995 |
| 6,020,252 | A | 2/2000 | Aspar et al. | JP | 3-132055 A | 10/1995 |
| 6,033,974 | A | 3/2000 | Henley et al. | JP | 2000-94317 A | 11/1995 |
| 6,048,411 | A | 4/2000 | Henley et al. | JP | 3-265156 A | 4/1996 |
| 6,077,383 | A | 6/2000 | Laporte | JP | 4-246594 A | 7/1998 |
| 6,083,324 | A | 7/2000 | Henley et al. | JP | 4-076503 A | 2/1999 |
| 6,120,597 | A | 9/2000 | Levy et al. | JP | 5-211128 A | 6/1999 |
| 6,150,239 | A | 11/2000 | Goesele et al. | JP | 7-215800 A | 6/1999 |
| 6,159,824 | A | 12/2000 | Henley et al. | JP | 59-193904 A | 7/1999 |
| 6,171,965 | B1 | 1/2001 | Kang et al. | JP | 59-046750 A | 4/2000 |
| 6,184,111 | B1 | 2/2001 | Henley et al. | WO | WO 95/10718 A1 | 8/1990 |
| 6,214,701 | B1 | 4/2001 | Matsushita et al. | WO | WO 95/20824 A1 | 12/1991 |
| 6,225,192 | B1 | 5/2001 | Aspar et al. | WO | WO 95/31825 A1 | 6/1995 |
| 6,548,382 | B1 | 4/2003 | Henley et al. | WO | WO 99/35674 A1 | 8/1995 |

FOREIGN PATENT DOCUMENTS

| | | |
|---|---|---|
| EP | 665 588 A1 | 4/1974 |
| EP | 867 917 A2 | 1/1975 |
| EP | 763 849 A1 | 4/1975 |
| EP | 867 921 A2 | 1/1982 |
| EP | 961 312 A2 | 6/1982 |
| EP | 155 875 A1 | 2/1990 |
| EP | 112 230 A1 | 8/1990 |
| EP | 112 238 A2 | 12/1991 |
| EP | 084 287 A1 | 9/1992 |
| EP | 099 778 A1 | 3/1993 |
| EP | 504 714 A2 | 2/1995 |
| EP | 164 281 A1 | 6/1995 |
| EP | 181 249 A1 | 8/1995 |
| EP | 533 551 A1 | 3/1996 |
| EP | 355 913 A1 | 3/1997 |
| EP | 379 828 A2 | 9/1998 |
| EP | 459 177 A2 | 9/1998 |
| EP | 660 140 A1 | 12/1999 |
| FR | 2261802 A1 | 2/1984 |
| FR | 2266304 A | 4/1984 |
| FR | 2235474 A1 | 12/1984 |
| FR | 2298880 A1 | 12/1984 |
| FR | 2715503 A1 | 7/1990 |
| FR | 2681472 A1 | 5/1991 |
| FR | 2714524 A1 | 6/1991 |
| FR | 2519437 A1 | 9/1991 |
| FR | 2715501 A1 | 11/1991 |
| FR | 1558881 | 8/1992 |
| FR | 2715502 A1 | 9/1992 |
| FR | 2720189 A1 | 8/1993 |
| FR | 2529383 A1 | 12/1993 |
| FR | 2537768 A1 | 1/1994 |
| FR | 2537777 A1 | 1/1994 |
| FR | 2560426 A1 | 1/1994 |
| FR | 2563377 A1 | 5/1994 |
| FR | 2575601 A1 | 9/1994 |
| FR | 2725074 A1 | 8/1995 |
| GB | 2 231 197 A | 2/1990 |
| GB | 2 211 991 A | 3/1993 |
| JP | 59-114744 A | 3/1952 |
| JP | 59-019394 A | 11/1958 |
| JP | 7-254690 A | 9/1978 |
| JP | 7-263291 A | 8/1983 |
| JP | 53-104156 A | 10/1983 |
| JP | 8-097389 A | 1/1984 |
| JP | 10-200080 A | 3/1984 |
| JP | 11-045840 A | 3/1984 |
| JP | 2901031 B2 | 7/1984 |

OTHER PUBLICATIONS

Burggraff, P., "Advanced Plasma Source: What's Working?" *Semiconductor International*, pp. 56–59 (May 1994).

Basta, N., "Ion–Beam Implantation," *High Technology*, (1985).

Carter et al., "The Collection of Ions Implanted in Semi-conductors II. Rnage distributions Derived from Collection and Sputter–Etch Curves," *Radiation Effects*, 16:107–114 (1972).

Cassidy, Victor M., "Ion Implantation Process Toughens Metalworking Tools," *Modern Metals*, pp. 65–67 (1984).

Cheung, N.W., "Plasma Immersion Ion Implantation for Semiconductor Processing," *Material Chemistry and Physics*, 46(2–3): 132–139 (1996).

Choyke et al., "Mechanical Response of Single Crystal Si to Very High Fluence H+ Implantation," *Nuc. Instr. Meth.*, 209–210:407–412 (1983).

Choyke et al., " Implanted Hydrogen Effects at High Concentrations in Model Low Z Shielding Materials," *J. Nuc. Mtrls.*, 122–23:1585–86 (1984).

Choyke et al., "A Comparative Study of Near–Surface Effects Due to Very High Fluence H+ Implantation in Single Crystal FZ, CZ, and Web SI," *Mat. Res. Soc. Symp. Proc.*, 27:359–364 (1984).

Chu et al. "Plasma Immersion Ion Implantation—A Fledgling Technique for Semiconductor Processing," *Materials Science and Engineering Reports: A Review Journal*, R17(6–7): 207–280 (1996) cover page and table of contents only.

Chu et al., "Recent Applications of Plasma Immersion Ion Implantation," *Semiconductor International*, pp. 165–172 (1996).

Chu, Paul K., "Synthesis of SOI Materials Using Plasma Immersion Ion Implantation," *1997 Mat. Res. Soc. Symp. Proc.*, 438:333–343 (1997).

Corbett et al., "Embrittlement of Materials: Si(H) as a Model System," *J. Nuc. Mtrls.*, 169: 179–184 (1989).

Grovenor, C.R.M., *Microelectronic Materials*, pp. 73–75 (1989).

Hulett, D.M. et al., "Ion Nitriding and Ion Implantation: A Comparison," *Metal Progress*, pp. 18–21 (1985).

I.B.M. Technical Disclosure Bulletin, vol. 29: No. 3, p. 1416 (Aug. 1986).

Johnson et al., "Hydrogen–Induced Platelets in Silicon: Separation of Nucleation and Growth," *Mtrls. Sci. Forum*, 83–87:33–38 (1992).

Lee et al., "A Novel Pattern Transfer Process for Bonded SOI Giga–bit DRAMS," *1996 IEEE Int'l. SOI Conference Proceedings, IEEE Electron Devices Society*, (1996.).

Li, J., "Novel Semiconductor Substrate Formed by Hydrogen Ion Implantation into Silicon," *Appl. Phys. Lett.*, 55(21):2223–2224 (1989).

Lu et al., "SOI Material Technology Using Plasma Immersion Ion Implantation," *Proceedings 1996 IEEE International SOI Conference* (Oct. 1996).

Mahajan et al., *Principles of Growth and Processing of Semiconductors*, WCB McGraw–Hill, chapter 6, pp. 262–269.

Matsuda et al., "Large Diameter Ion Beam Implantation System," *Nuclear Instruments and Methods*, B21:314–316 (1987).

Milnes et al., "Peeled Film Technology for solar Cells," pp. 338–341.

Moreau, Wayne M., *Semiconductor Lithography, Principles, Practices, and Materials*, Plenum Press (1988).

Oshima et al., "Defects in Si irradiated with D–T neutrons, D and He Ions," *J. Nuc. Mtrls.*, 179–181:947–950 (1991).

*Patent Abstracts of Japan*, vol. 7, No. 107 (E–174), (May 11, 1993) JP–58–030145 (Feb. 22, 1983).

Picraux et al., "Ion Implantation of Surfaces," *Scientific American*, 252(3):102–113 (1985).

Reiner et al., "A New Low–Energy Ion Implanter for Bombardment of Cylindrical Surfaces," *Vacuum*, 35(12):577–578 (1985).

Sioshansi, Piran, "Ion Beam Modification of Materials for Industry," *Thin Solid Film*, 118:61–71 (1984).

Smith, D.L., *Thin–Film Deposition*, McGraw–Hill, Inc., pp. 185–196, 278–293.

Sze, S.M., *VLSI Technology*, 2nd Edition, pp. 9–10, (1988).

Tong et al., "A 'smarter–cut' approach to low temperature silicon layer transfer," *Appl. Phys. Lett.*, 72(1):49–51 (1998).

Tong et al., *Semiconductor Wafer Bonding: Science and Technology*, John Wiley & Sons, Inc., pp. 152–171.

Wolf, Stanley Ph.D., *Silicon Processing for the VLSI Era vol. 2*, pp. 66–79, Lattice Press (1990).

U.S. Dept. of Energy, "The Fusion Connection: . . . ", *Plasma Coating*, pp. 6–7 (1985).

Veldkamp et al., Binary Optics, *Scientific American*, pp. 50–55 (May 1992).

* cited by examiner

GETTERING TECHNIQUE FOR WAFERS MADE USING A CONTROLLED CLEAVING PROCESS

CROSS REFERENCE TO RELATED APPLICATIONS

This application claims priority from the provisional patent application entitled GETTERING TECHNIQUE FOR WAFERS MADE USING A CONTROLLED CLEAVING PROCESS, filed Jul. 18, 1997 and assigned Application No. 60/059,980.

BACKGROUND OF THE INVENTION

The present invention relates to the manufacture of integrated circuits. More particularly, the present invention provides a technique for forming a gettering layer in a silicon-on-insulator wafer made using a controlled cleaving process, for example.

Integrated circuits are fabricated on chips of semiconductor material. These integrated circuits often contain thousands, or even millions, of transistors and other devices. In particular, it is desirable to put as many transistors as possible within a given area of semiconductor because more transistors typically provide greater functionality, and a smaller chip means more chips per wafer and lower costs.

Some integrated circuits are fabricated on a slice or wafer, of single-crystal (monocrystalline) silicon, commonly termed a "bulk" silicon wafer. Devices on such "bulk" silicon wafer typically are isolated from each other. A variety of techniques have been proposed or used to isolate these devices from each other on the bulk silicon wafer, such as a local oxidation of silicon ("LOCOS") process and others. These techniques, however, are not free from limitations. For example, conventional isolation techniques consume a considerable amount of valuable wafer surface area on the chip, and often generate a non-planar surface as an artifact of the isolation process. Either or both of these considerations generally limit the degree of integration achievable in a given chip.

An approach to achieving very-large scale integration (VLSI) or ultra-large scale integration (ULSI) is by using a semiconductor-on-insulator (SOI) wafer. An SOI wafer typically has a layer of silicon on top of a layer of an insulator material. A variety of techniques have been proposed or used for fabricating the SOI wafer. These techniques include, among others, growing a thin layer of silicon on a sapphire substrate, bonding a layer of silicon to an insulating substrate, and forming an insulating layer beneath a silicon layer in a bulk silicon wafer. In an SOI integrated circuit, essentially complete device isolation is often achieved using conventional device processing methods by surrounding each device, including the bottom of the device, with an insulator. An advantage SOI wafers have over bulk silicon wafers is that the area required for isolation between devices on an SOI wafer is less than the area typically required for isolation on a bulk silicon wafer.

SOI offers other advantages over bulk silicon technologies as well. For example, SOI offers a simpler fabrication sequence compared to a bulk silicon wafer. Devices fabricated on an SOI wafer may also have better radiation resistance, less photo-induced current, and less cross-talk than devices fabricated on bulk silicon wafers. However, many problems that have already been solved regarding fabricating devices on bulk silicon wafers remain to be solved for fabricating devices on SOI wafers.

Numerous limitations, however, still exist with the fabrication of SOI wafers. For example, devices within integrated circuits in SOI wafers are very sensitive to the presence of even minute concentrations of some impurities. For example, metals, such as copper, nickel, silver, gold, or iron, within the active region of a device typically degrade several device characteristics, including leakage current and breakdown voltage. These and other metals rapidly diffuse through silicon at temperatures typical of semiconductor device fabrication processes. These impurities often become trapped in the active region of the SOI wafer. That is, the SOI wafer includes a dielectric layer or insulating layer underlying the active region that tends to keep impurities in the active layer, rather than diffusing down into the bulk silicon. Accordingly, SOI wafers are prone to device and reliability problems caused by the presence of impurities that cannot diffuse out of the active region.

From the above, it is seen that a technique for removing impurities from active regions of an integrated circuit made on an SOI wafer is highly desirable.

SUMMARY OF THE INVENTION

According to the present invention, a technique including a method and device for removing impurities from an SOI wafer made using a controlled cleaving process is provided. In an exemplary embodiment, the present invention provides an SOI wafer with a gettering layer for removing impurities from an active region. This gettering layer removes impurities from the device, thereby preventing a possibility of quality and reliability problems, e.g., lowered breakdown voltage, increased leakage current, and the like. Additionally, the gettering layer provides for "lifetime" engineering of the device made on the SOI wafer.

In a specific embodiment, the present invention provides an SOI wafer made by way of a "cleaving" process with an implanted gettering layer. The process includes a step of providing an SOI wafer, where the thin layer of material (e.g., silicon) was bonded onto an insulating layer. Gas-forming particles, such as hydrogen or helium ions, are implanted or introduced into the thin layer of material or other region of the SOI wafer. The SOI wafer is thermally processed so that the implanted particles create, for example, microbubbles or implanted precipitates in the wafer. These microbubbles act as gettering sites for impurities in the thin layer of material. Alternatively, the particles act as gettering sites for the impurities. The thin layer of material has been separated from, for example, a bulk donor silicon wafer by a controlled cleaving process, such as the one described in U.S. Provisional Application Ser. No. 60/046,276 in the name of Henley et al. ("Henley"), which is hereby incorporated by reference for all purposes.

In an alternative embodiment, the present invention provides an SOI wafer made by way of a cleaving process with a deposited gettering layer. The gettering layer is, for example, a layer of polysilicon, which can be patterned, formed on a bulk monocrystalline silicon donor or receptor wafer. The thin layer of material, including the gettering layer, has been separated from, for example, a bulk donor silicon wafer by a controlled cleaving process. A gettering layer, such as a layer of polysilicon, on the thin layer, such as a layer of monocrystalline silicon, can provide effective gettering after a different time-temperature product, i.e. thermal budget, than microbubbles. Thus, a gettering layer on the thin layer can be used in addition to or alternatively to microbubble or particle gettering sites.

Numerous benefits are achieved by way of the present invention over pre-existing techniques. These benefits include, among others, gettering of impurities from active regions of an integrated circuit device made on an SOI wafer. Additionally, the present invention occurs by way of improved processing techniques using PIII, for example. PIII is relatively cost effective, easy to use and in some instances produces less impurity metal contamination than other ion implantation techniques. Furthernore, the present technique provides "lifetime" engineering of the device, which is likely to have improved reliability from the present gettering layer(s). These and other benefits are described throughout the specification and more particularly below.

These and other embodiments of the present invention, as well as its advantages and features are described in more detail in conjunction with the text below and attached figures.

DESCRIPTION OF SPECIFIC EMBODIMENTS

The present invention provides an SOI wafer with a gettering layer for removing impurities from an active region of an integrated circuit to be formed on the wafer. In a specific embodiment, a gettering layer is formed in an SOI wafer made using a controlled cleaving process. The gettering layer is generally beneath an active region of the devices that will be formed on the SOI wafer. The SOI wafer is made using a controlled cleaving process, which is described in Henley, noted above.

1. Silicon on Insulator Substrate

Figure 1:
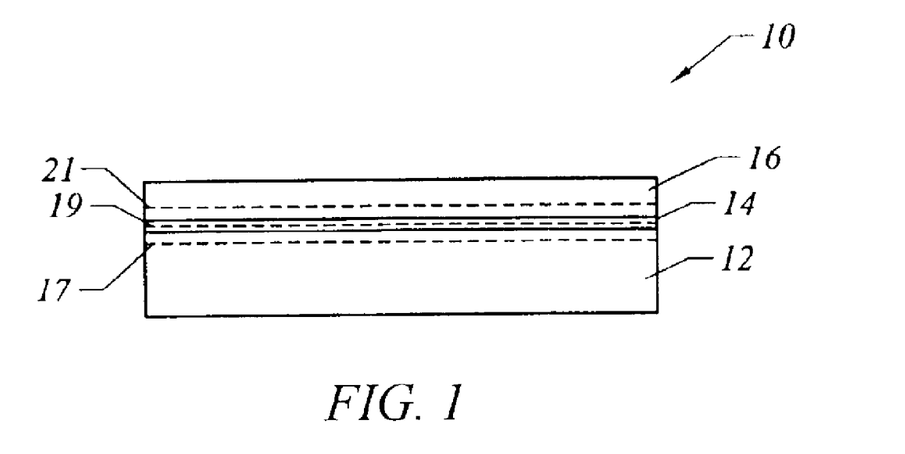
FIG. 1 is a simplified cross-sectional view diagram of an SOI wafer having a gettering layer according to the present invention.

FIG. 1 is a simplified cross section of an SOI wafer 10 according to an embodiment of the present invention. The Fig. is not to scale and is merely an illustration, which should not limit the scope of the claims herein. The SOI wafer 10 includes numerous features including a lower substrate 12, an insulating layer(s) 14, and a film of material 16, which will include active devices in later processing steps. The film of material, which can be a silicon material, is defined on the insulating material using a controlled cleaving process, which will be described in more detail below. A gettering layer can be formed in a region 17 below the insulating layer 14, or be formed in a region 19 in the insulating layer 14, or be formed in a region 21 underlying the active region in the film 16 of silicon material. A variety of techniques can be used to introduce the gettering layer into region 17, 19, or 21. These techniques include, among other, implantation of particles using ion beam implanting or plasma immersion implanting, and film deposition such as chemical vapor deposition and physical vapor deposition. The techniques for forming the gettering layer will be described throughout the present specification, and more particularly below.

2. Controlled Cleaving Process

A process for fabricating a silicon-on-insulator substrate having a gettering layer using the controlled cleaving process may be briefly outlined as follows:

(1) Provide a donor silicon wafer (which may be coated with a dielectric material);

(2) Introduce particles into the silicon wafer to a selected depth to define a thickness of silicon film to be detached;

(3) Introduce particles into the silicon wafer to a selected depth to define a gettering layer (option 1);

(4) Provide a receptor substrate material (which may be coated with a dielectric material and may also have a gettering layer (option 2));

(5) Bond the donor silicon wafer to the receptor substrate material by joining the implanted face to the receptor substrate material;

(6) Increase global stress (or energy) of implanted region at selected depth without initiating a cleaving action (optional);

(7) Provide stress (or energy) to a selected region of the bonded substrates to initiate a controlled cleaving action at the selected depth;

(8) Provide additional energy to the bonded substrates to sustain the controlled cleaving action to free the thickness of silicon film from the silicon wafer (optional);

(9) Complete bonding of donor silicon wafer to the receptor substrate;

(10) Introduce particles into the silicon wafer to a selected depth to define a gettering layer (option 3);

(11) Polish a surface of the thickness of silicon film; and (12) Perform any remaining steps, if necessary.

The above sequence of steps provides a method of forming an SOI wafer having a gettering layer using a controlled cleaving process. This process begins cleaving in a controlled mariner by limiting the amount of energy applied to the substrate. Further propagation of the cleaving action can occur by providing additional energy to selected regions of the substrate to sustain the cleaving action, or using the energy from the initiation step to provide for further propagation of the cleaving action. A gettering layer according to this present invention can be applied to either the receptor or donor wafer using, for example, option 1, 2, or 3 (or any combination of these) to complete the SOI wafer structure, which is shown above. Further details with regard to the above sequence of steps are described below in references to the Figs.

Figure 2:
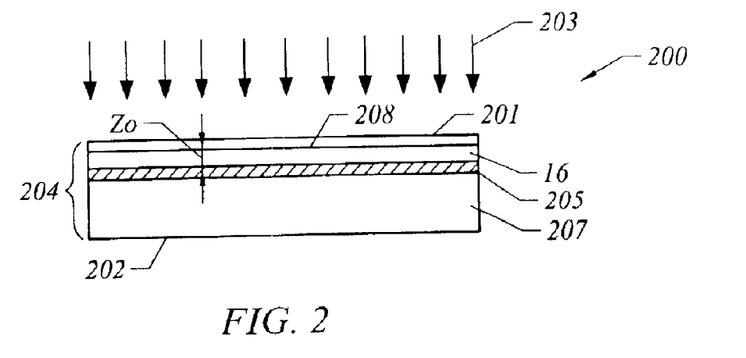
FIGS. 2–12 are simplified cross-sectional view diagrams of the above SOI wafer made using the controlled cleaving process according to the present invention.

FIGS. 2–12 are simplified cross-sectional view diagrams of substrates undergoing a fabrication process for a silicon-on-insulator wafer according to the present invention. The process begins by providing a semiconductor substrate 200 similar to the silicon wafer, as shown by FIG. 2. Substrate or donor substrate 200 includes a material region 16 to be removed, which is a thin relatively uniform film derived from the substrate material 207. The silicon wafer 200 includes a top surface 201, a bottom surface 202, and a thickness 204. Material region also includes a thickness ($z_0$), within the thickness of the silicon wafer. Optionally, a dielectric layer 208 (e.g., silicon nitride, silicon oxide, silicon oxynitride) overlies the top surface of the substrate.

Selected energetic particles 203 implant through the top surface of the silicon wafer to a selected depth, which defines the thickness of the material region, termed the thin film of material. As shown, the particles have a desired concentration 205 at the selected depth ($z_0$). A variety of techniques can be used to implant the energetic particles into the silicon wafer. These techniques include ion implantation using, for example, beam line ion implantation equipment manufactured from companies such as Applied Materials, Eaton Corporation, Varian, and others. Alternatively, implantation occurs using a plasma immersion ion implantation ("PIII") technique. Of course, techniques used depend upon the application, such as an ion shower technique.

Depending upon the application, smaller mass particles are generally selected to reduce a possibility of damage to the material region. That is, smaller mass particles easily travel through the substrate material to the selected depth without substantially damaging the material region that the particles traversed through. For example, the smaller mass particles (or energetic particles) can be almost any charged (e.g., positive or negative) and/or neutral atoms or molecules, or electrons, or the like. In a specific embodiment, the particles can be neutral and/or charged particles including ions such as H+ ions, rare gas ions such as helium and its isotopes, and neon, and deuterium. The particles can also be derived from compounds such as gases, e.g., hydrogen gas, water vapor, methane, hydrides, and hydrogen compounds, and other light atomic mass particles. Alternatively, the particles can be any combination of the above particles, and/or ions and/or molecular species and/or atomic species.

Figure 3:
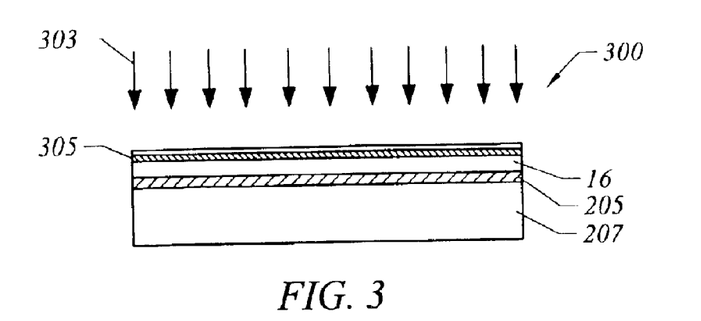

A gettering layer can be defined in the donor substrate using a variety of techniques. FIG. 3 is a simplified diagram of an implantation technique used to define the gettering layer 305 in the donor wafer. As shown, particles are introduced into a region directly underlying the insulating layer 208 to define the gettering layer 305 in the substrate 300. These particles can include a variety of materials, which form either gas bubbles or implanted precipitates. Gas-forming particles may not significantly react with the substrate that they are implanted into, but rather form gas pockets, or microbubbles, within the substrate and are suitable for subsequent thermal treatment. Examples of gas-forming particles include ions formed from the noble gases, including helium, neon, argon, krypton, and xenon. These pockets or microbubbles provide trapping sites for impurities. It is believed that the internal surfaces of these microbubbles provide a lower energy state for impurities, and also that the formation of the bubbles may create localized crystalline defects, providing further trapping sites. It has been estimated that the interior surface of a microbubble may trap a copper impurity ion by providing a site that is about 2.2 eV lower in energy than the bulk solution site for copper ions. Alternatively, the implanted particles can form precipitates, which may react with the substrate, but are not sensitive to subsequent thermal treatment of the wafer. The precipitates form sites which are believed to trap impurities therein or thereon.

In most of the embodiments, the distribution of these gettering sites depends upon the energies used to implant the gas-forming particles, among other factors. In this instance, the gettering layer is made up of several microbubbles distributed over a range of depth from the top surface of the wafer. The microbubbles formed after thermally treating the implanted gas-forming particles. The choice of ion dosage and energy to form the gettering layer depends upon many factors, including the depth of the insulator layer, the type of semiconductor material the gettering layer is to be formed in, the bubble-forming species, and the intended device type and active region, among other factors. As an example, $1 \times 10^{17}$ cm$^{-2}$ helium ions implanted into a {100} silicon wafer at 30 keV and annealed for one-half hour at 700° C. resulted in a layer of microbubbles in the silicon wafer about 0.3 µm below the top surface of the wafer. The bubbles can have an average diameter of about 8 nm. Annealing for longer periods of time or at a higher temperature resulted in larger bubbles being formed, resulting in a reduction of total microbubble surface area. High-temperature annealing also generally reduces the dislocations, stacking faults, and other crystal imperfections associated with microbubble gettering. The implantation of gas-forming particles, as well as the implantation of insulator-forming particles, may be performed by a variety of techniques, including ion beam implantation and plasma immersion ion implantation (PIII).

Figure 4:
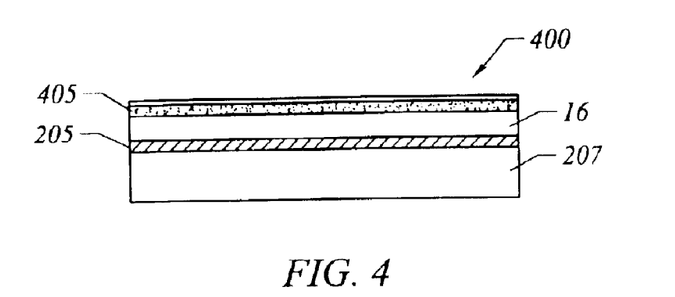

In an alternative embodiment, a gettering layer can be defined using a deposited layer 405 in the substrate 400, as shown by FIG. 4. The deposited layer can be a variety of materials including polysilicon or heavily doped N-type polysilicon, which is often doped using phosphorous or the like. The polycrystalline silicon layer may be formed by a variety of conventional techniques, and will eventually become a gettering layer in an SOI wafer. It is understood that a layer of amorphous silicon could be formed instead of the polysilicon layer, but polysilicon layers typically have small grains, which are advantageous for gettering impurities. Heavily doped polysilicon can also be used, for example. In some embodiments, the polysilicon is doped using phosphorous or the like. The polysilicon can be doped via diffusion or implantation or in-situ doped, depending upon the application.

Grain boundaries and high degree of lattice disorder in the polysilicon act as sinks for mobile impurities. The polysilicon layer provides gettering sites that differ from the sites provided by microbubbles. For example, the grain boundaries and lattice disorder associated with polysilicon do not anneal out at the same time-temperature product as some of the gettering sites provided by microbubbles. The polysilicon layer may further include impurities, such as oxygen or other precipitate-forming impurities, or lattice-strain-inducing impurities, such as phosphorous, to further improve the effectiveness of the gettering layer.

Figure 5:
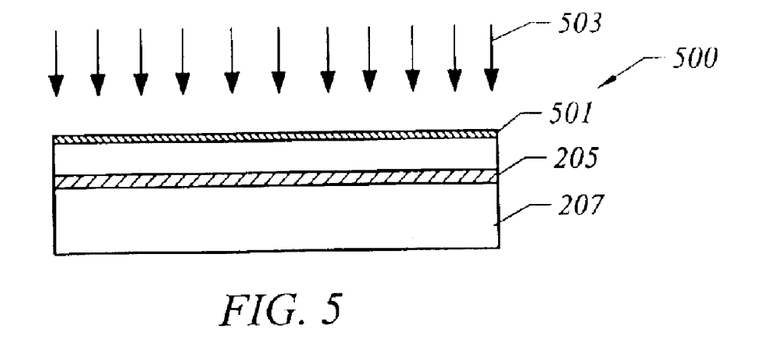

In yet an alternative specific embodiment, the present invention provides a gettering layer 501, which is defined on the top surface of the substrate 500, as illustrated by FIG. 5. As shown, particles 503 are introduced into a region directly in the insulating layer to define the gettering layer 501. These particles can include a variety of materials, which form either gas bubbles or implanted precipitates such as those described above, but can be others.

In a modification to any of the above embodiments, the gettering layer including those implanted or deposited can be patterned. For example, the pattern can be formed by a "shadow" mask, or masking and photolithography steps. Additionally, a variety of patterns can be used depending upon the applications. For instance, the patterns can be in the form of a plurality of strips, numerous concentric circles, a checkerboard, and others. Alternatively, the implanted region can be specifically placed in to be non-active regions of the device. These non-active regions include, among others, field isolation oxide regions, peripheral regions of the device, and "streets." Of course, the type of pattern used depends highly upon the application.

Figure 6:
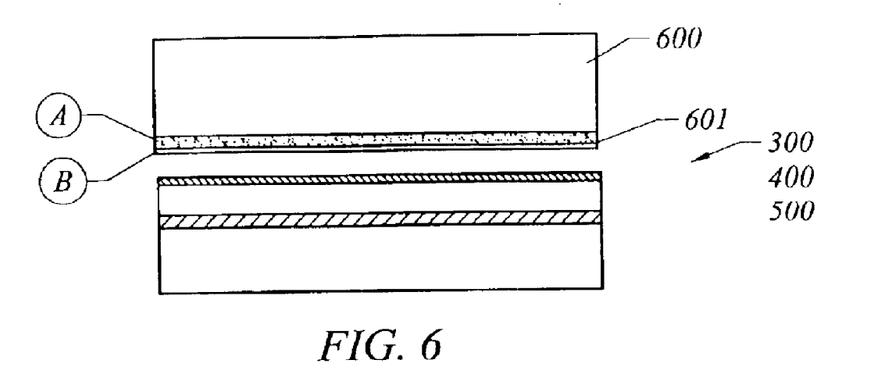

The process uses a step of joining the implanted silicon wafer (e.g., 300, 400, or 500) to a workpiece or receptor wafer 600, as illustrated in FIG. 6. The workpiece may also be a variety of other types of substrates such as those made of a dielectric material (e.g., glass, silicon nitride, silicon dioxide), a conductive material (polysilicon, group III/V materials, metal), and plastics (e.g., polyimide-based materials). In the present example, however, the workpiece is a silicon wafer.

In a specific embodiment, a gettering layer can be defined on the receptor or target wafer 600. For example, the gettering layer can be made of particles, which are implanted into an insulating layer 601 as shown by reference letter B. Alternatively, the gettering layer can be made of particles, which are implanted into a region underlying the insulating layer 601 as shown by reference letter A. Furthermore, deposition techniques such as chemical vapor deposition or physical vapor deposition is used to form a gettering layer in either region A or B. This gettering layer can be made of a variety of materials including polysilicon, amorphous silicon, heavily doped polysilicon, and others. The heavily doped polysilicon includes, among other materials, phosphorous doped polysilicon, which is implanted, diffused, or in-situ doped. The gettering layer in the receptor wafer can be combined with any of the other gettering layers defined throughout the present specification, as well as others.

In a modification to any of the above embodiments using the receptor substrate, the gettering layer including those implanted or deposited can be patterned. For example, the pattern can be formed by a "shadow" mask or masking and photolithography steps. Additionally, a variety of patterns can be used depending upon the applications. For instance, the patterns can be in the form of a plurality of strips, numerous concentric circles, a checkerboard, and others. Alternatively, the implanted region can be specifically placed in to be non-active regions of the device. These non-active regions include, among others, field isolation oxide regions, peripheral regions of the device, and "streets." Of course, the type of pattern used depends highly upon the application.

In a specific embodiment, the silicon wafers are joined or fused together using a low temperature thermal step. The low temperature thermal process generally ensures that the implanted particles do not place excessive stress on the material region, which can produce an uncontrolled cleave action. In one aspect, the low temperature bonding process occurs by a self-bonding process. In particular, one wafer is stripped to remove oxidation therefrom (or one wafer is not oxidized). A cleaning solution treats the surface of the wafer to form O—H bonds on the wafer surface. An example of a solution used to clean the wafer is a mixture of $H_2O_2$—$H_2SO_4$. A dryer dries the wafer surfaces to remove any residual liquids or particles from the wafer surfaces. Self-bonding occurs by placing a face of the cleaned wafer against the face of an oxidized wafer.

Alternatively, a self-bonding process occurs by activating one of the wafer surfaces to be bonded by plasma cleaning. In particular, plasma cleaning activates the wafer surface using a plasma derived from gases such as argon, ammonia, neon, water vapor, and oxygen. The activated wafer surface is placed against a face of the other wafer, which has a coat of oxidation thereon. The wafers are in a sandwiched structure having exposed wafer faces. A selected amount of pressure is placed on each exposed face of the wafers to self-bond one wafer to the other.

Alternatively, an adhesive disposed on the wafer surfaces is used to bond one wafer onto the other. The adhesive includes an epoxy, polyimide-type materials, and the like. Spin-on-glass layers can be used to bond one wafer surface onto the face of another. These spin-on-glass ("SOG") materials include, among others, siloxanes or silicates, which are often mixed with alcohol-based solvents or the like. SOG can be a desirable material because of the low temperatures (e.g., 150 to 250° C.) often needed to cure the SOG after it is applied to surfaces of the wafers.

Alternatively, a variety of other low temperature techniques can be used to join the donor wafer to the receptor wafer. For instance, an electrostatic bonding technique can be used to join the two wafers together. In particular, one or both wafer surface(s) is charged to attract to the other wafer surface. Additionally, the donor wafer can be fused to the receptor wafer using a variety of commonly known techniques. Of course, the technique used depends upon the application.

Figure 7:
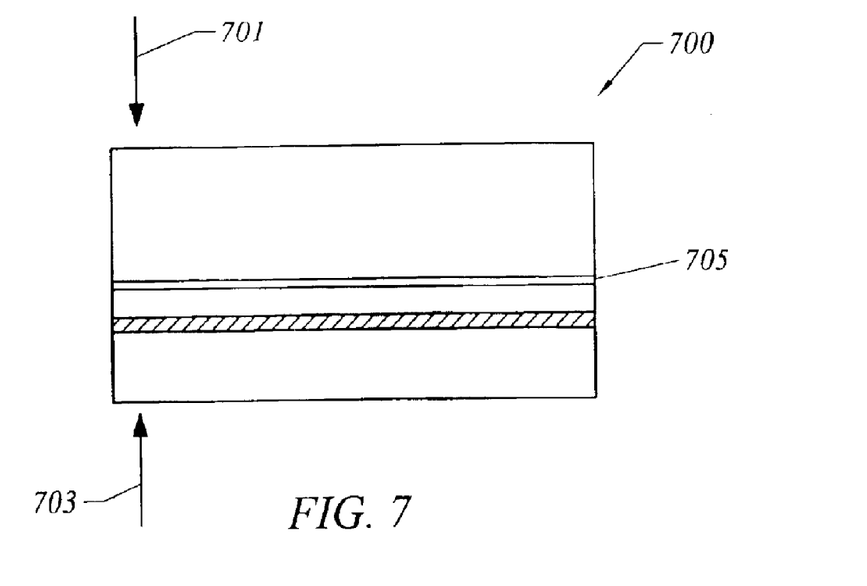

After bonding the wafers into a sandwiched structure 700, as shown in FIG. 7, the method includes a controlled cleaving action to remove the substrate material to provide a thin film of substrate material overlying an insulator the receptor silicon wafer. The controlled leaving occurs by way of selective energy placement or positioning or targeting of energy sources onto the donor and/or receptor wafers. For instance, an energy impulse(s) can be used to initiate the cleaving action. The impulse (or impulses) is provided using an energy source which include, among others, a mechanical source, a chemical source, a thermal sink or source, and an electrical source.

The controlled cleaving action is also illustrated by way of FIG. 7. For instance, a process for initiating the controlled cleaving action uses a step of providing energy 701, 703 to a selected region of the substrate to initiate a controlled cleaving action at the selected depth ($z_0$) in the substrate, whereupon the cleaving action is made using a propagating cleave front to free a portion of the substrate material to be removed from the substrate. In a specific embodiment, the method uses a single impulse to begin the cleaving action. Alternatively, the method uses an initiation impulse, which is followed by another impulse or successive impulses to selected regions of the substrate. Alternatively, the method provides an impulse to initiate a cleaving action which is sustained by a scanned energy along the substrate. Alternatively, energy can be scanned across selected regions of the substrate to initiate and/or sustain the controlled cleaving action.

Optionally, an energy or stress of the substrate material is increased toward an energy level necessary to initiate the cleaving action, but not enough to initiate the cleaving action before directing an impulse or multiple successive impulses to the substrate according to the present invention. The global energy state of the substrate can be raised or lowered using a variety of sources such as chemical, mechanical, thermal (sink or source), or electrical, alone or in combination. The chemical source can include particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electromagnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, a gas jet, an electron beam, a thermoelectric heating, and a furnace. The thermal sink can be selected from a fluid jet, a liquid jet, a gas jet, a cryogenic fluid, a super-cooled liquid, a thermoelectric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used depends upon the application. As noted, the global source increases a level of energy or stress in the material region without initiating a cleaving action in the material region before providing energy to initiate the controlled cleaving action.

In a preferred embodiment, the method maintains a temperature which is below a temperature of introducing the particles into the substrate. In some embodiments, the substrate temperature is maintained between −200 and 450° C. during the step of introducing energy to initiate propagation of the cleaving action. Substrate temperature can also be maintained at a temperature below 400° C. or below 350° C. In preferred embodiments, the method uses a thermal sink to initiate and maintain the cleaving action, which occurs at conditions significantly below room temperature. Details of the controlled cleaving process is described in Henley, as previously noted.

Figure 8:
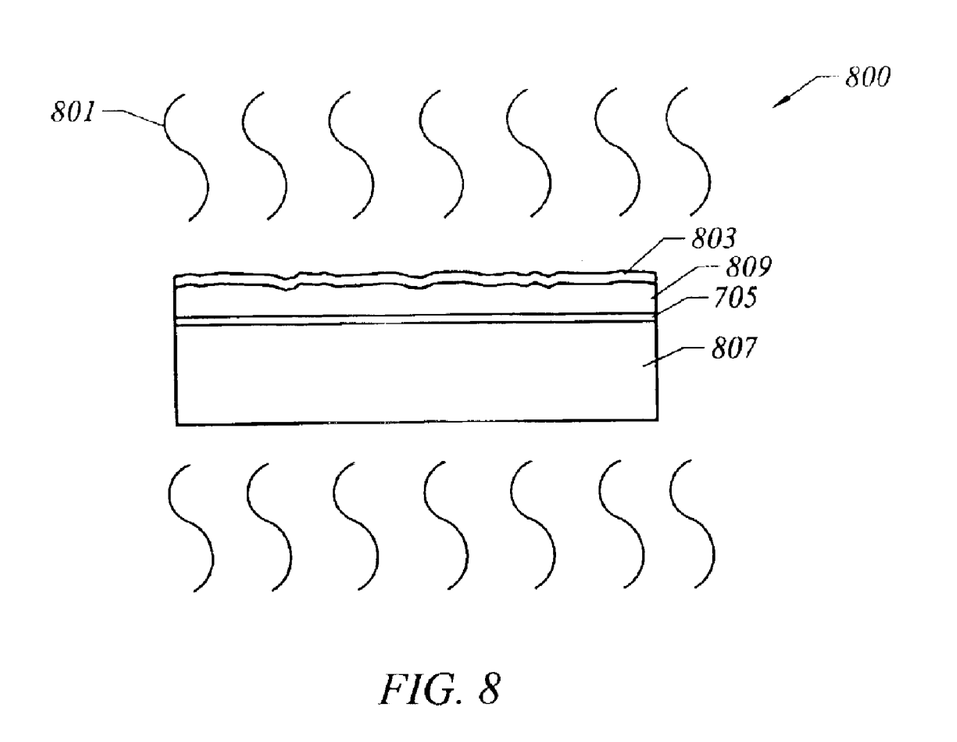

A final bonding step occurs between the receptor wafer and thin film of material region according to some embodiments, as illustrated by FIG. 8. In one embodiment, one silicon wafer has an overlying layer of silicon dioxide, which is thermally grown overlying the face before cleaning the thin film of material. The silicon dioxide can also be formed using a variety of other techniques, e.g., chemical vapor deposition. The silicon dioxide between the wafer surfaces fuses together thermally in this process.

In some embodiments, the oxidized silicon surface from either the receptor wafer or the thin film of material region (from the donor wafer) are further pressed together and are subjected to an oxidizing ambient 801, as shown in FIG. 8, for example. The oxidizing ambient can be in a diffusion furnace for steam oxidation, hydrogen oxidation, or the like. A combination of the pressure and the oxidizing ambient fuses the two silicon wafers together at the oxide surface or interface. These embodiments often require high temperatures (e.g., 700° C.).

Alternatively, the two silicon surfaces are further pressed together and subjected to an applied voltage between the two wafers. The applied voltage raises temperature of the wafers to induce a bonding between the wafers. This technique limits the amount of crystal defects introduced into the silicon wafers during the bonding process, since substantially no mechanical force is needed to initiate the bonding action between the wafers. Of course, the technique used depends upon the application.

After bonding the wafers, silicon-on-insulator has a receptor substrate 807 with an overlying film of silicon material 809 and a sandwiched oxide layer 705 between the receptor substrate and the silicon film, as also illustrated in FIG. 8 The detached surface of the film of silicon material is often rough 803 and needs fishing. Finishing occurs using a combination of grinding and/or polishing techniques. In some embodiments, the detached surface undergoes a step of grinding using, for examples, techniques such as rotating an abrasive material overlying the detached surface to remove any imperfections or surface roughness therefrom. A machine such as a "back grinder" made by a company called Disco may provide this technique.

Figure 9:
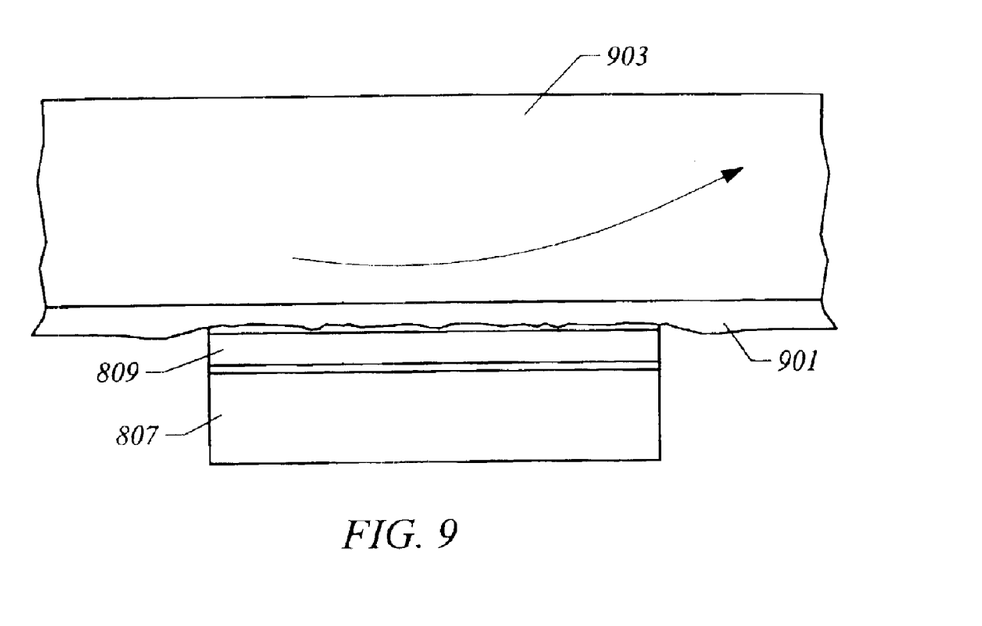

Alternatively, chemical mechanical polishing or planarization ("CMP") techniques finish the detached surface of the film, as illustrated by FIG. 9. In CMP, a slurry mixture is applied directly to a polishing surface 901 which is attached to a rotating platen 903. This slurry mixture can be transferred to the polishing surface by way of an orifice, which is coupled to a slurry source. The slurry is often a solution containing an abrasive and an oxidizer, e.g., $H_2O_2$, $KIO_3$, ferric nitrate. The abrasive is often a borosilicate glass, titanium dioxide, titanium nitride, aluminum oxide, aluminum trioxide, iron nitrate, cerium oxide, silicon dioxide (colloidal silica), silicon nitride, silicon carbide, graphite, diamond, and any mixtures thereof. This abrasive is mixed in a solution of deionized water and oxidizer or the like. Preferably, the solution is acidic.

Figure 10:
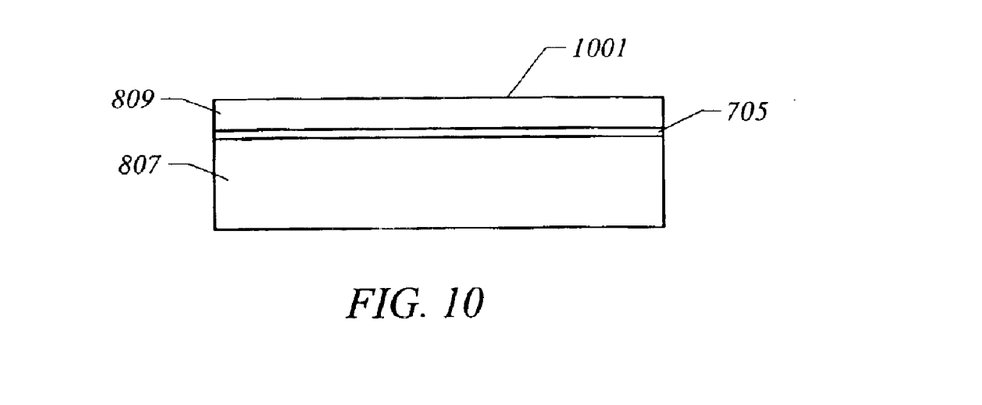

This acid solution generally interacts with the silicon material from the wafer during the polishing process. The polishing process preferably uses a poly-urethane polishing pad. An example of this polishing pad is one made by Rodel and sold under the tradename of IC-1000. The polishing pad is rotated at a selected speed. A carrier head which picks up the receptor wafer having the film applies a selected amount of pressure on the backside of the receptor wafer such that a selected force is applied to the film. The polishing process removes about a selected amount of film material, which provides a relatively smooth film surface 1001 for subsequent processing, as illustrated by FIG. 10.

In certain embodiments, a thin film of oxide overlies the film of material overlying the receptor wafer. The oxide layer forms during the thermal annealing step, which is described above for permanently bonding the film of material to the receptor wafer. In these embodiments, the finishing process is selectively adjusted to first remove oxide and the film is subsequently polished to complete the process. Of course, the sequence of steps depends upon the particular application.

Figure 11:
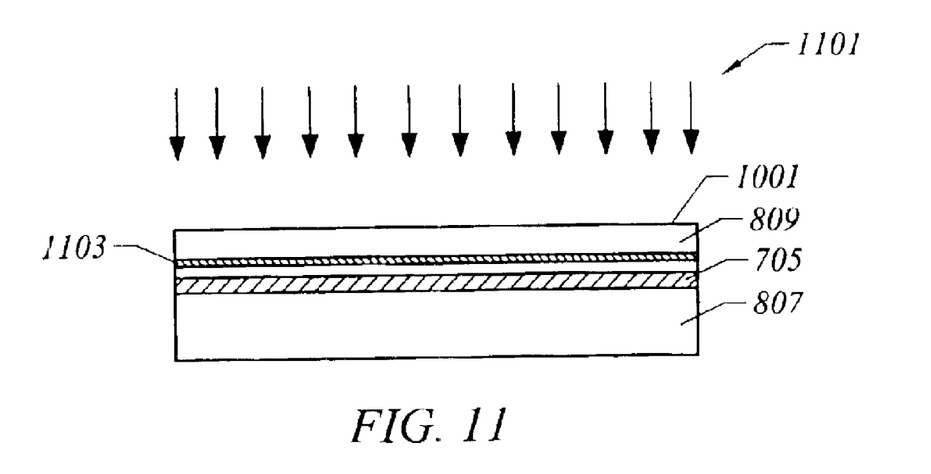

In a further alternative embodiment, the gettering layer 1103 can be formed by way of implanting gas forming particles or precipitate forming particles 1101 after forming the SOI wafer using the controlled cleaving process, as illustrated by FIG. 11. FIG. 11 shows insulating layer 705 beneath the top surface 1001 of the wafer, which includes the substrate 807, the insulating layer 705, and the film 809 of material. These gas-forming particles, such as ions, are implanted into the wafer beneath the top surface of the wafer, but above the insulating layer to a selected depth 1103. Gas-forming particles may not significantly react with the substrate that they are implanted into, but rather form gas pockets, or microbubbles, within the substrate after suitable thermal treatment. Examples of gas-forming particles include hydrogen ions and ions formed from the noble gases, including helium, neon, argon, krypton, and xenon. These pockets or microbubbles provide trapping sites for impurities. It is believed that the internal surfaces of these microbubbles provide a lower energy state for impurities, and also that the formation of the bubbles may create localized crystalline defects, providing further trapping sites. It has been estimated that the interior surface of a microbubble may trap a copper impurity ion by providing a site that is about 2.2 eV lower in energy than the bulk solution site for copper ions. Alternatively, the implanted particles can form precipitates, which may react with the substrate, but are not sensitive to subsequent thermal treatment of the wafer. The precipitates form sites which are believed to trap impurities therein or thereon.

In most of the embodiments, the distribution of these gettering sites depends upon the energies used to implant the gas-forming particles, among other factors. In this instance, the gettering layer is made up of several microbubbles distributed over a range of depth from the top surface of the wafer. The microbubbles formed after thermally treating the implanted gas-forming particles. The choice of ion dosage and energy to form the gettering layer depends upon many factors, including the depth of the insulator layer, the type of semiconductor material the gettering layer is to be formed in, the bubble-forming species, and the intended device type and active region, among other factors. As an example, $1 \times 10^{17}$ $cm^{-2}$ helium ions implanted into a {100} silicon wafer at 30 keV and annealed for one-half hour at 700° C. resulted in a layer of microbubbles in the silicon wafer about 0.3 $\mu$m below the top surface of the wafer. The bubbles can have an average diameter of about 8 nm. Annealing for longer periods of time or at a higher temperature resulted in larger bubbles being formed, resulting in a reduction of total microbubble surface area. High-temperature annealing also generally reduces the dislocations, stacking faults, and other crystal imperfections associated with microbubble gettering. The implantation of gas-forming particles, as well as the implantation of insulator-forming particles, may be performed by a variety of techniques, including ion beam implantation and plasma immersion ion implantation (PIII). Although the embodiment of FIG. 11 shows introducing particles to region 1103, the particles can also be introduced into the insulating layer 705 or beneath the insulating layer in substrate 807.

Figure 12:
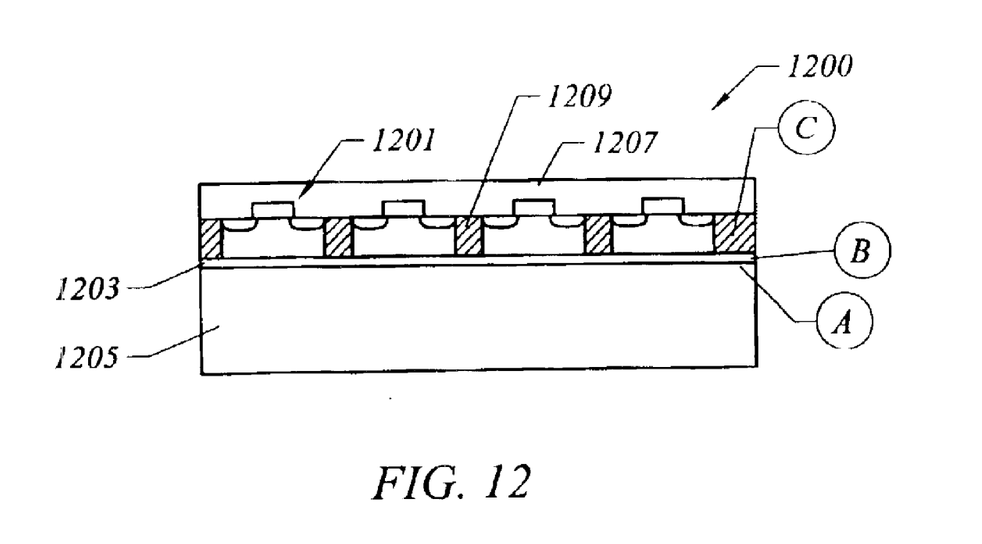

In a specific embodiment, the silicon-on-insulator substrate undergoes a series of process steps for formation of integrated circuits thereon. These processing steps are described in S. Wolf, Silicon Processing for the VLSI Era (Volume 2), Lattice Press (1990), which is hereby incorporated by reference for all purposes. A portion of a completed wafer 1200 including integrated circuit devices is illustrated by FIG. 12, for example. As shown, the portion of the wafer includes active devices regions 1201 and isolation regions 1209. The active devices 1201 are field effect transistors each having a source/drain region and a gate electrode as shown. A dielectric isolation layer 1207 is defined overlying the active devices to isolate the active devices from any overlying layers, Also shown are insulating layer 1203 and substrate 1205. Gettering layers made using any of the above techniques can be defined by the locations shown by reference letters A, B, or C, or any combination thereof.

While the above is a complete description of specific embodiments of the present invention, various modifications, variations, and alternatives may be employed. For example, a silicon alloy may be substituted for the polysilicon gettering layer. Furthermore, the donor wafer does not have to be silicon, but could be another semiconductor material, such as germanium, silicon carbide, silicon-germanium alloy, or a heterostructure, among others. In such an instance, the gettering layer material would be chosen such that it is appropriate according to the principles discussed above. That is, the gettering layer would be chosen so that it provided an impurity sink in relation to the material used in the active region of devices. Other variations will be apparent to persons of skill in the art. These equivalents and alternatives are intended to be included within the scope of the present invention.

Therefore, the scope of this invention should not be limited to the embodiments described, and should instead be defined by the following claims.

What is claimed is:

1. A method for producing a semiconductor wafer comprising:
    providing a donor substrate;
    disposing a patterned gettering layer within a region of the donor substrate;
    introducing first particles into the substrate to a first depth to produce a stressed layer, thereby dividing the donor substrate into a semiconductor layer and a remaining portion of the donor substrate; and
    wherein the gettering layer provides trapping sites for mobile impurity species.

2. The method of claim 1 wherein the semiconductor layer comprises monocrystalline silicon and the gettering layer comprises polycrystalline silicon.

3. The method of claim 1 wherein the gettering layer is selected from an implanted layer or a deposited layer.

4. The method of claim 1 wherein the semiconductor layer comprises germanium.

5. The method of claim 1 wherein the donor substrate is a silicon substrate having <100> crystal orientation.

6. The method of claim 1 wherein the gettering layer comprises microbubbles or implanted precipitates within the semiconductor layer.

7. The method of claim 6 wherein the microbubbles are formed by implanting gas-forming particles into the semiconductor layer.

8. The method of claim 7 wherein the gas-forming particles comprise hydrogen ions.

9. The method of claim 7 wherein the gas-forming particles are implanted into the semiconductor layer using a plasma immersion ion implantation technique.

10. A method of producing a semiconductor wafer comprising:
    providing a donor substrate;
    disposing a patterned gettering layer within a region of the donor substrate;
    implanting first particles into the substrate to a first depth to produce a stressed layer, thereby dividing the donor substrate into a semiconductor layer and a remaining portion of the donor substrate;
    applying energy to a region of the donor substrate to produce a controlled cleaving action within the stressed layer to separate the semiconductor layer from the remaining portion of the donor substrate;
    wherein the gettering layer provides trapping sites for mobile impurity species.

11. The method of claim 10 further including, prior to the applying step, increasing a global energy of the stress layer without initiating the cleaving action.

12. The method of claim 10, wherein the patterned gettering layer comprises a deposited layer comprising a polysilicon material.

13. The method of claim 12, wherein the patterned deposited layer includes an impurity.

14. The method of claim 13, wherein the impurity is oxygen.

15. The method of claim 10, wherein the implanted first particles are hydrogen ions.

16. The method of claim 10, wherein the donor substrate is a silicon substrate having <100> crystal orientation.

17. The method of claim 1, wherein the implanted first particles are hydrogen ions.

18. A method for producing a semiconductor wafer comprising:
    providing a donor substrate having <100> crystal orientation;
    providing a patterned gettering layer within a region of the donor substrate;
    implanting hydrogen ions into the substrate to a first depth to produce a stressed layer, thereby dividing the donor substrate into a semiconductor layer and a remaining portion of the donor substrate; and
    wherein the gettering layer provides trapping sites for mobile impurity species.

19. The method of claim 18, wherein the patterned gettering layer includes an impurity.

20. The method of claim 19, wherein the impurity is oxygen.

* * * * *